US009507907B2

(12) United States Patent
Fouquet et al.

(10) Patent No.: US 9,507,907 B2
(45) Date of Patent: Nov. 29, 2016

(54) COMPUTATIONAL WAFER INSPECTION

(71) Applicant: ASML NETHERLANDS B.V., Veldhoven (NL)

(72) Inventors: Christophe David Fouquet, Retie (BE); Bernardo Kastrup, Veldhoven (NL); Arie Jeffrey Den Boef, Waalre (NL); Johannes Catharinus Hubertus Mulkens, Valkenswaard (NL); James Benedict Kavanagh, Veldhoven (NL); James Patrick Koonmen, Santa Clara, CA (US); Neal Patrick Callan, Lake Oswego, OR (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/730,993

(22) Filed: Jun. 4, 2015

(65) Prior Publication Data
US 2015/0356233 A1 Dec. 10, 2015

Related U.S. Application Data

(60) Provisional application No. 62/010,221, filed on Jun. 10, 2014, provisional application No. 62/023,589, filed on Jul. 11, 2014.

(51) Int. Cl.
*G06F 17/50* (2006.01)
*H01L 21/66* (2006.01)
*G03F 7/20* (2006.01)

(52) U.S. Cl.
CPC ........... *G06F 17/5081* (2013.01); *G03F 7/705* (2013.01); *G03F 7/7065* (2013.01); *G03F 7/70525* (2013.01); *G06F 17/5009* (2013.01); *H01L 22/20* (2013.01)

(58) Field of Classification Search
CPC . G06F 17/5081; G06F 17/5009; H01L 22/20
USPC ........................................................ 716/112
See application file for complete search history.

(56) References Cited

U.S. PATENT DOCUMENTS

| 6,847,588 | B1 * | 1/2005 | Wallace et al. ....... G01S 3/8083 367/119 |
| 6,882,745 | B2 * | 4/2005 | Brankner et al. ................ G01N 21/95607 382/144 |

(Continued)

FOREIGN PATENT DOCUMENTS

| CN | 103645611 | 3/2014 |
| CN | 103645612 | 3/2014 |

(Continued)

OTHER PUBLICATIONS

Stefan Hunsche et al., U.S. Appl. No. 14/616,905, filed Feb. 9, 2015.

(Continued)

*Primary Examiner* — Sun Lin
(74) *Attorney, Agent, or Firm* — Pillsbury Winthrop Shaw Pittman LLP

(57) ABSTRACT

Disclosed herein is a computer-implemented defect prediction method for a device manufacturing process involving processing a portion of a design layout onto a substrate, the method comprising: identifying a hot spot from the portion of the design layout; determining a range of values of a processing parameter of the device manufacturing process for the hot spot, wherein when the processing parameter has a value outside the range, a defect is produced from the hot spot with the device manufacturing process; determining an actual value of the processing parameter; and determining or predicting, using the actual value, an existence, a probability of existence, a characteristic, or a combination selected therefrom, of a defect produced from the hot spot with the device manufacturing process.

20 Claims, 9 Drawing Sheets

(56) References Cited

U.S. PATENT DOCUMENTS

| | | | |
|---|---|---|---|
| 7,333,192 B2 * | 2/2008 | Nakano et al. | G01N 21/94 250/559.45 |
| 7,689,948 B1 | 3/2010 | White et al. | |
| 8,407,630 B1 | 3/2013 | Chan et al. | |
| 8,755,045 B2 | 6/2014 | Lin et al. | |
| 8,918,742 B2 | 12/2014 | Feng et al. | |
| 2008/0147374 A1 | 6/2008 | Chan et al. | |
| 2008/0148194 A1 | 6/2008 | Chan et al. | |
| 2008/0148195 A1 | 6/2008 | Chan et al. | |
| 2008/0253644 A1 | 10/2008 | Xu et al. | |
| 2009/0157360 A1 | 6/2009 | Ye et al. | |
| 2009/0206252 A1 | 8/2009 | Obazaki et al. | |
| 2010/0324878 A1 | 12/2010 | Lee et al. | |
| 2011/0143271 A1 * | 6/2011 | Koshiba et al. | G03F 7/0002 430/30 |
| 2012/0278768 A1 | 11/2012 | Yang et al. | |
| 2013/0031518 A1 | 1/2013 | Robles et al. | |
| 2013/0031522 A1 | 1/2013 | Robles et al. | |
| 2013/0176558 A1 | 7/2013 | Lin et al. | |
| 2013/0267047 A1 | 10/2013 | Shih et al. | |
| 2014/0005998 A1 | 1/2014 | Ye et al. | |
| 2015/0227654 A1 * | 8/2015 | Hunsche et al. | G06F 17/5009 716/54 |

FOREIGN PATENT DOCUMENTS

| | | |
|---|---|---|
| CN | 103744267 | 4/2014 |
| DE | 10 2005 009 536 | 8/2006 |
| EP | 1 875 307 | 1/2008 |
| JP | 2008-242112 | 10/2008 |
| JP | 2008-268560 | 11/2008 |
| JP | 2009-163110 | 7/2009 |
| JP | 2010-102055 | 5/2010 |
| JP | 4958616 | 6/2012 |
| JP | 5045445 | 10/2012 |
| JP | 2013-175016 | 9/2013 |
| TW | 200422887 | 11/2004 |
| TW | 200636521 | 10/2006 |
| TW | 200830129 | 7/2008 |

OTHER PUBLICATIONS

Guangqing Chen et al., U.S. Appl. No. 14/577,820, filed Dec. 19, 2014.
Guangqing Chen et al., U.S. Appl. No. 14/577,901, filed Dec. 19, 2014.
Guangqing Chen et al., U.S. Appl. No. 14/578,036, filed Dec. 19, 2014.
Guangqing Chen et al., U.S. Appl. No. 14/577,966, filed Dec. 19, 2014.
Scott Anderson Middlebrooks et al., U.S. Appl. No. 61/917,305, filed Dec. 17, 2013.
Gang Chen et al., U.S. Appl. No. 62/047,420, filed Sep. 8, 2014.
Frank Gang Chen et al., U.S. Appl. No. 62/053,629, filed Sep. 22, 2014.
Gang Chen et al., U.S. Appl. No. 62/093,281, filed Dec. 17, 2014.
Venugopal Vellanki et al., U.S. Appl. No. 62/116,256, filed Feb. 13, 2015.
Venugopal Vellanki et al., U.S. Appl. No. 62/117,261, filed Feb. 17, 2015.
Stefan Hunsche et al., U.S. Appl. No. 62/129,405, filed Mar. 6, 2015.
Scott Anderson Middlebrooks et al., U.S. Appl. No. 62/089,692, filed Dec. 9, 2014.
Scott Anderson Middlebrooks et al., U.S. Appl. No. 62/089,712, filed Dec. 9, 2014.
Wim Tjibbo Tel et al., U.S. Appl. No. 62/115,547, filed Feb. 12, 2015.
International Search Report and Written Opinion mailed Jan. 5, 2016 in corresponding International Patent Application No. PCT/EP2015/061609.
Chun-Wei Wu et al., "Freeform source optimization for improving litho-performance of warm spots," Proc. of SPIE, vol. 8166, pp. 816630-1-816630-8 (2011).
Thomas Huang et al., "Improvement of lithography process by using a FlexRay illuminator for memory applications," Proc. of SPIE, vol. 7973, pp. 79731X-1-79731X-11 (2011).
Disclosed Anonymously, "Defect Prediction," Research Disclosure, Database No. 604033, pp. 1-7 (Aug. 2014).

\* cited by examiner

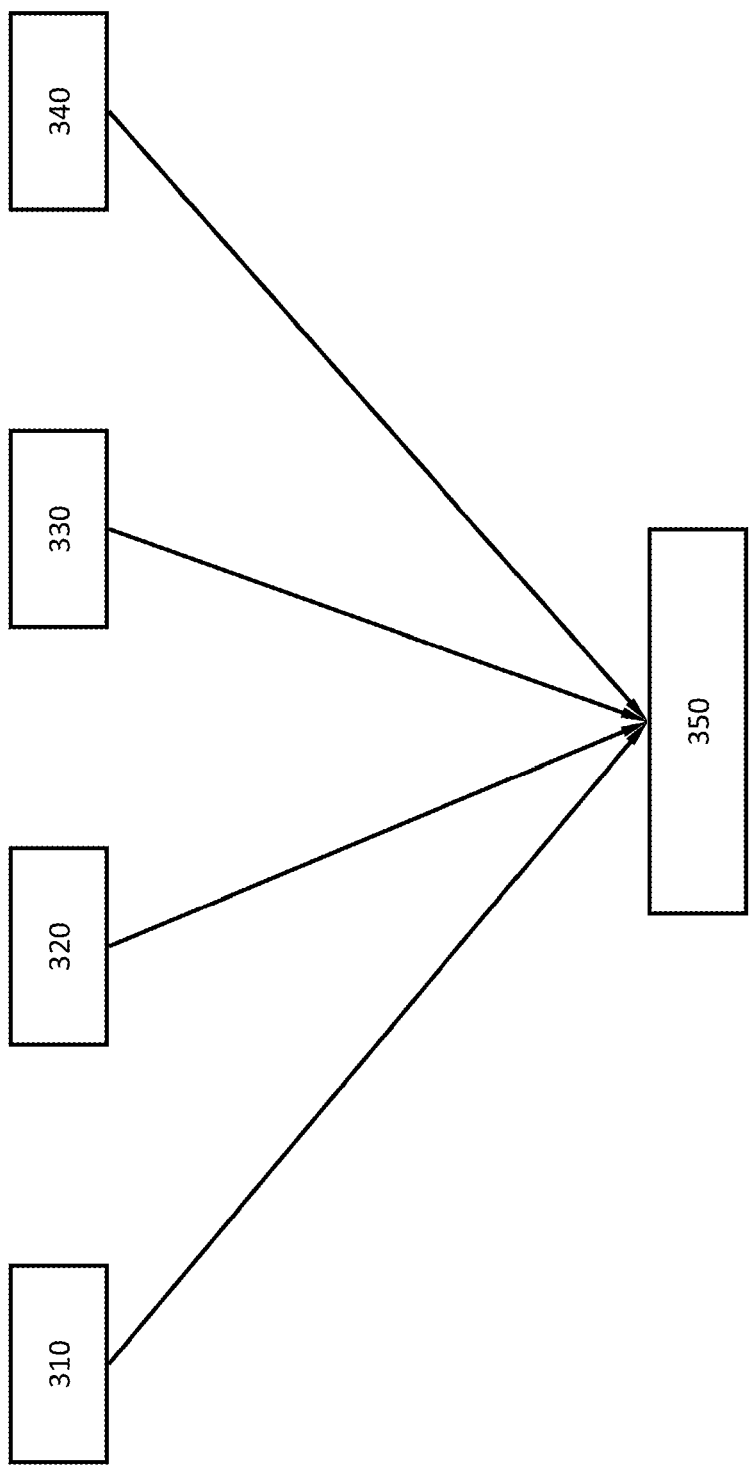

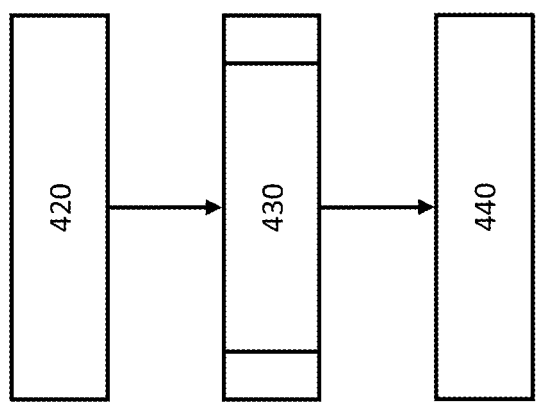

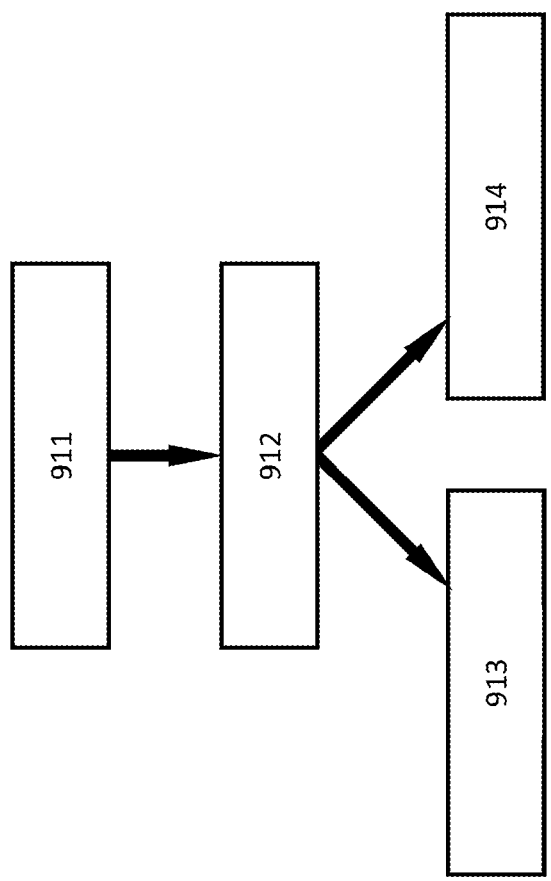

COMPUTATIONAL WAFER INSPECTION

CROSS-REFERENCE TO RELATED APPLICATIONS

This application claims the benefit under 35 USC 119(e) of prior U.S. Provisional Patent Application No. 62/010,221, filed Jun. 10, 2014, and U.S. Provisional Patent Application No. 62/023,589, filed Jul. 11, 2014, all of which are hereby incorporated by reference in the present disclosure in their entirety.

FIELD

The present invention relates to a method of optimizing the performance of semiconductor manufacturing process. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC ("design layout"), and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

SUMMARY

An aspect comprises a computer-implemented defect prediction method for a device manufacturing process involving processing a portion of a design layout onto a substrate, the method comprising: identifying a hot spot from the portion of the design layout; determining a range of values of a processing parameter of the device manufacturing process for the hot spot, wherein when the processing parameter has a value outside the range, a defect is produced from the hot spot with the device manufacturing process; determining an actual value of the processing parameter; determining or predicting, using the actual value, existence, probability of existence, a characteristic, or a combination thereof, of a defect produced from the hot spot with the device manufacturing process.

In an embodiment of the method, the determining or predicting the existence, the probability of existence, the characteristic, or the combination thereof, further uses a characteristic of the hot spot, a characteristic of the design layout, or both.

In an embodiment of the method, the method further comprises adjusting or compensating for the processing parameter using the existence, the probability of existence, the characteristic, or the combination thereof, of the defect.

In an embodiment of the method, the method further comprises carrying out reiteratively the determining or predicting the existence, the probability of existence, the characteristic, or the combination thereof, of the defect, and adjusting or compensating for the processing parameter.

In an embodiment of the method, the method further comprises determining or predicting, using the adjusted or compensated processing parameter, existence, probability of existence, a characteristic, or a combination thereof, of a residue defect produced from the hot spot using the device manufacturing process.

In an embodiment of the method, the method further comprises indicating whether the hot spot is to be inspected at least partially based on the determined or predicted existence, probability of existence, the characteristic, or the combination thereof, of the residue defect.

In an embodiment of the method, the method further comprises indicating whether the hot spot is to be inspected at least partially based on the determined or predicted existence, probability of existence, the characteristic, or the combination thereof, of the defect.

In an embodiment of the method, the hot spot is identified using an empirical model or a computational model.

In an embodiment of the method, the processing parameter is any one or more selected from: actual wafer stage position and tilt, actual reticle stage position and tilt, focus, dose, a source parameter, a projection optics parameter, data obtained from metrology, and/or data from an operator of a processing apparatus used in the device manufacturing process.

In an embodiment of the method, the processing parameter is data obtained from metrology and the data obtained from metrology is obtained from a diffractive tool, or an electron microscope.

In an embodiment of the method, the processing parameter is determined or predicted using a model or by querying a database.

In an embodiment of the method, the determining or predicting the existence, the probability of existence, the characteristic, or the combination thereof, of the defect comprises simulating an image or expected patterning contours of the hot spot under the processing parameter and determining an image or contour parameter.

In an embodiment of the method, the hot spot is identified using a sensitivity of patterns of the portion, with respect to the processing parameter.

In an embodiment of the method, the method further comprises inspecting the hot spot.

In an embodiment of the method, the method further comprises adjusting the range of values at least partially based on inspection of the hot spot.

In an embodiment of the method, the device manufacturing process involves using a lithography apparatus.

In an embodiment of the method, the processing parameter is determined immediately before the hot spot is processed.

In an embodiment of the method, the processing parameter is selected from local processing parameters or global processing parameters.

In an embodiment of the method, the identifying of the hot spot includes identifying a location thereof.

In an embodiment of the method, the defect is undetectable before the substrate is irreversibly processed.

A further aspect comprises a method of manufacturing a device involving processing a pattern onto a substrate or onto a die of the substrate, the method comprising: determining a processing parameter before processing the substrate or the die; predicting or determining existence of a defect, probability of existence of a defect, a characteristic of a defect, or a combination thereof, using the processing parameter before processing the substrate or the die, and using a characteristic of the substrate or the die, a characteristic of the geometry of a pattern to be processed onto the substrate or the die, or both; adjusting the processing parameter based on the prediction or determination so as to eliminate, reduce the probability of or reduce the severity of, the defect.

In an embodiment of the method, the method further comprises identifying a hot spot from the pattern.

In an embodiment of the method, the defect is a defect produced from the hot spot.

In an embodiment of the method, the characteristic of the substrate or the die is a process window of the hot spot.

An even further aspect comprises a computer-implemented defect prediction method for a device manufacturing process involving processing a portion of a design layout onto a substrate, the method comprising: identifying a hot spot from the portion of the design layout; determining or predicting existence, probability of existence, a characteristic, or a combination thereof, of a defect produced from the hot spot with the device manufacturing process; determining whether to inspect the hot spot at least partially based on the determination or prediction of the existence, probability of existence, a characteristic, or a combination thereof, of the defect.

An even further aspect comprises a computer-implemented defect prediction method for a device manufacturing process involving processing a portion of a design layout onto a substrate, the method comprising: identifying a hot spot from the portion of the design layout; determining a sensitivity of the hot spot with respect to a processing parameter of the device manufacturing process for the hot spot; generating a mark having the same sensitivity; adding the mark into the design layout.

A further aspect comprises a method of manufacturing a device comprising: the computer-implemented defect prediction method according to any of the previous embodiments; and indicating which of plurality of hot spots to inspect at least partially based on the determined or predicted existence, probability of existence, characteristic, or the combination thereof, of the defect.

In an embodiment of the method, the defect is one or more selected from: necking, line pull back, line thinning, CD error, overlapping, resist top loss, resist undercut and/or bridging.

A further aspect comprises a method of defect prediction for a device manufacturing process involving processing a portion of a design layout onto a substrate, comprising: determining an actual value of a processing parameter of the device manufacturing process; constructing an inspection map based at least partially on the actual value, wherein the inspection map comprises positions of potential defects on the substrate.

In an embodiment of the method, the method further comprises inspecting the substrate at the positions of potential defects.

In an embodiment of the method, the method further comprises inspecting the substrate at only the positions of potential defects.

In an embodiment of the method, the method further comprises presenting the inspection map to a user.

A further aspect comprises a computer program product comprising a computer readable medium having instructions recorded thereon, the instructions when executed by a computer implementing the method of any of the previous embodiments.

A further aspect comprises a metrology tool configured to inspect a substrate onto which a portion of a design layout is processed by a device manufacturing process, comprising: a data transfer unit configured to receive positions of potential defects on the substrate; an inspection unit configured to selectively inspect the substrate at the positions.

In an embodiment of the metrology tool, the metrology tool is a diffractive tool or an electron microscope.

In an embodiment of the method, the inspecting of the substrate is performed using an electron microscope or a bright-field inspection tool.

In an embodiment of the method, the method further comprises presenting the inspection map to a user.

In an embodiment of the method, the constructing of the inspection map further comprises simulating at least some of the identified potential defects using a process simulation model.

In an embodiment of the method, the constructing of the inspection map further comprises to construct the inspection map in a format readable by a defect inspection tool.

A further aspect comprises a metrology tool configured to inspect a substrate onto which a portion of a design layout is processed by a device manufacturing process, comprising: a data transfer unit configured to receive positions of potential defects on the substrate; an inspection unit configured to selectively inspect the substrate at the positions.

In an embodiment of the metrology tool, the metrology tool is a diffractive tool or an electron microscope.

A further aspect comprises a metrology system for inspecting a substrate onto which a portion of a design layout is processed, the metrology system comprising the first metrology tool for determining an actual value of the processing parameter, and a defect prediction unit configured for executing a computer implemented method of any of the previous embodiments.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 shows exemplary sources of the processing parameters;

FIG. 4 shows an implementation of step 214 of FIG. 2;

FIG. 9 shows a flow chart for a method of defect prediction for a device manufacturing process involving processing a portion of a design layout onto a substrate, according to an embodiment.

DETAILED DESCRIPTION

Figure 1:
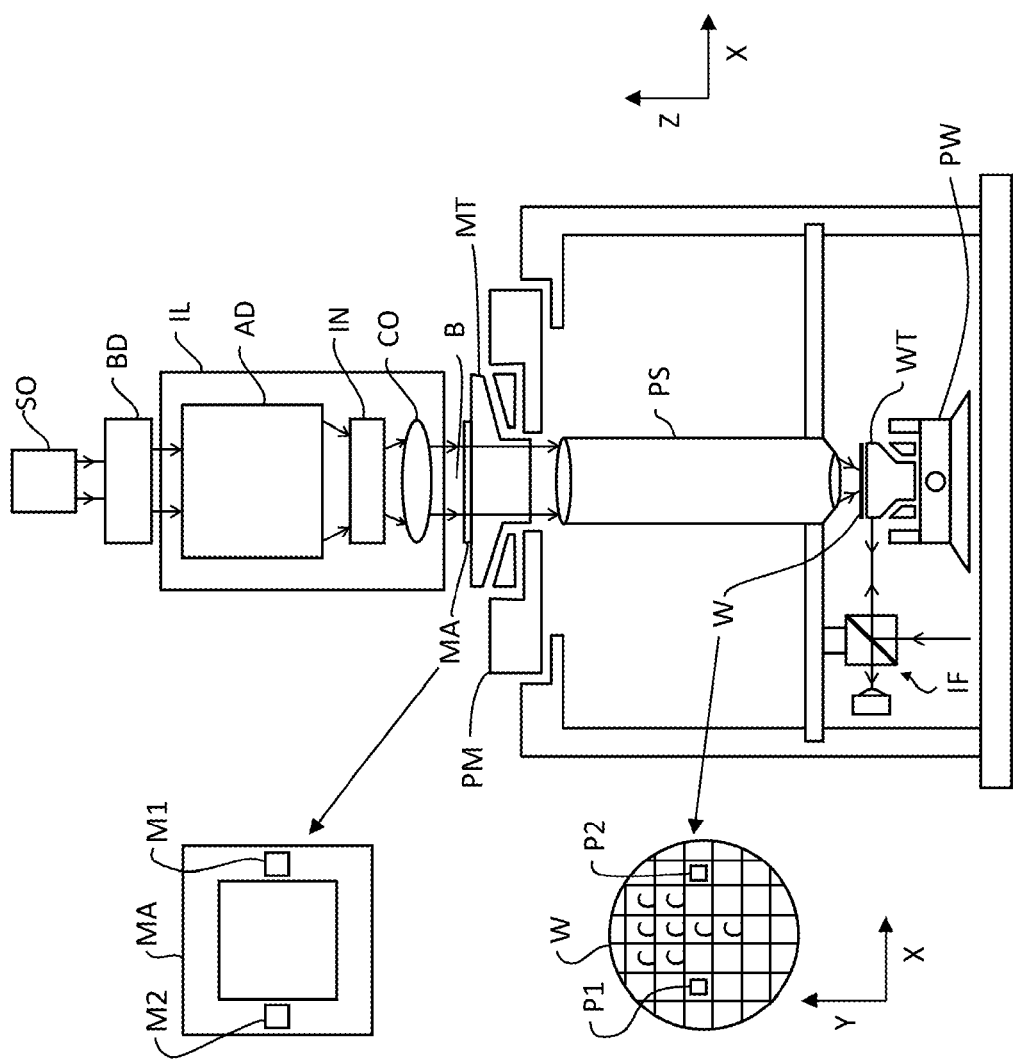
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle," "design layout" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam B of radiation (e.g. UV radiation or DUV radiation).

a support structure MT to support a patterning device (e.g. a mask) MA and connected to first positioning device PM to accurately position the patterning device with respect to item PS;

a substrate table (e.g. a wafer table) WT for holding a substrate (e.g. a resist coated wafer) W and connected to second positioning device PW for accurately positioning the substrate with respect to item PS; and a projection system (e.g. a refractive projection lens) PS configured to image a pattern imparted to the radiation beam B by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AD configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AD. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation B, having a desired uniformity and intensity distribution in its cross section.

The radiation beam B is incident on the patterning device (e.g. mask) MA, which is held on the support structure MT.

Having traversed the patterning device MA, the beam B passes through the lens PS which focuses the beam onto a target portion C of the substrate W. With the aid of the second positioning device PW and position sensor IF (e.g. an interferometric device), the substrate table WT can be moved accurately, e.g. so as to position different target portions C in the path of the beam B. Similarly, the first positioning device PM and another position sensor (which is not explicitly depicted in FIG. 1) can be used to accurately position the patterning device MA with respect to the path of the beam B, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam B is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam B is projected onto a target portion C (i.e. a single dynamic exposure). The velocity and direction of the substrate table WT relative to the support structure MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PS of a state of the art lithographic apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used. The projection system PS may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PS in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodizations (transmission variation across the pupil plane). The transmission map of a projection system PS may be used when designing a patterning device (e.g., mask) MA for the lithographic apparatus. Using a computational lithography technique, the patterning device MA may be designed to at least partially correct for apodizations.

A space of processing parameters under which a pattern will be produced within specifications may be referred to as a process window for that pattern. If a pattern is produced out of specifications, it is a defect. The patterns on a patterning device may be affected differently by variations of the processing parameters. For example, a pattern may be more sensitive to variations of the dose than another pattern. Therefore, the patterns on a patterning device may have different process windows. The sensitivity of a pattern with respect to a processing parameter may, for example, be measured by a partial derivative of a characteristic of the pattern with respect to the processing parameter. Examples of pattern specifications that relate to potential systematic defects include checks for necking, line pull back, line thinning, CD, edge placement, overlapping, resist top loss, resist undercut and bridging. The process window of all the patterns on a patterning device may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a lithography process, it is possible and economical to focus on the hot spots. When the hot spots are not defective, it is most likely that all the patterns are not defective.

Processing parameters may vary with position on a substrate and with time (e.g., between substrates, between dies). Such variation may be caused by change in the environment such as temperature and humidity. Other causes of such variations may include drift in one or more components in the processing apparatus such as the source, projection optics, substrate table, height variations of substrate surfaces, etc. in a lithography apparatus. It would be useful to be aware of such variations and their effects on PWLPs or potential patterning defects, and to adjust the lithography process to accommodate such variations so as to reduce actual defects. To reduce the computational cost of tracking these variations, one can choose to monitor only the hot spots.

Figure 2:
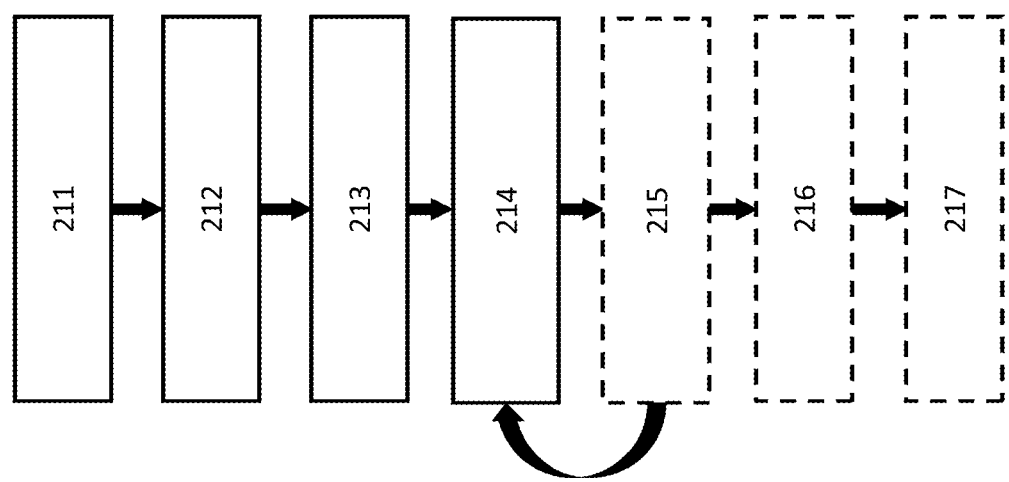
FIG. 2 shows a flow chart for a method of defect prediction for a device manufacturing process, according to an embodiment.

FIG. 2 shows a flow chart for a method of defect prediction for a device manufacturing process, according to an embodiment. In step 211, at least a hot spot is identified using any suitable method from a portion of a design layout. For example, the hot spot may be identified by analyzing patterns in the portion of the design layout using an empirical model or a computational model. In an empirical model, images (e.g., resist image, optical image, etch image) of the patterns are not simulated; instead, the empirical model predicts defects or probability of defects based on correlations between processing parameters, parameters of the patterns, and the defects. For example, an empirical model may be a classification model or a database of patterns prone to defects. In a computational model, a portion or a characteristic of the images is calculated or simulated, and defects are identified based on the portion or the characteristic. For example, a line pull back defect may be identified by finding a line end too far away from its desired location; a bridging defect may be identified by finding a location where two lines undesirably join; an overlapping defect may be identified by finding two features on separate layers undesirably overlap or undesirably not overlap. An empirical model is usually less computationally expensive than a computational model. In an example, the hot spots and/or their locations may be determined experimentally, such as by FEM wafer inspection or a suitable metrology tool.

In an embodiment, the hot spot may be identified using the sensitivity of the patterns with respect to a processing parameter. For example, if the sensitivity of a pattern is greater than a threshold, that pattern may be identified as a hot spot.

The defects may include those defects that cannot be detected in an after-development-inspection (ADI) (usually optical inspection), such as resist top loss, resist undercut, etc. Conventional inspection only reveals such defects after the substrate is irreversibly processed (e.g., etched), at which point the wafer cannot be reworked. So, such resist top loss defects cannot be detected using the current optical technology at the time of drafting this document. However, simulation may be used to determine where resist top loss may occur and what the severity would be. Based on this information, it may be either decided to inspect the specific possible defect using a more accurate inspection method (and typically more time consuming) to determine whether the defect needs rework, or it may be decided to rework the imaging of the specific resist layer (remove the resist layer having the resist top loss defect and recoat the wafer to redo the imaging of the specific layer) before the irreversible processing (e.g., etching) is done.

In step 212, a range of values of a processing parameter of the device manufacturing process is determined for the hot spot, where the device manufacturing process produces a defect from the hot spot when the processing parameter has a value outside the range. Multiple ranges of values for multiple processing parameters may also be determined for the hot spot. The one or more ranges determined may be compiled as a process window of the hot spot. It is possible to determine and/or compile process windows of multiple hot spots into a map, based on hot spot locations and process windows of individual hot spots—i.e. determine process windows as a function of hot spot locations. This process window map may characterize the layout-specific sensitivities and processing margins of the patterns. The processing parameters may be local—dependent on the locations of the hot spots, the dies, or both. The processing parameters may be global—independent of the locations of the hot spots and the dies.

Figure 7:
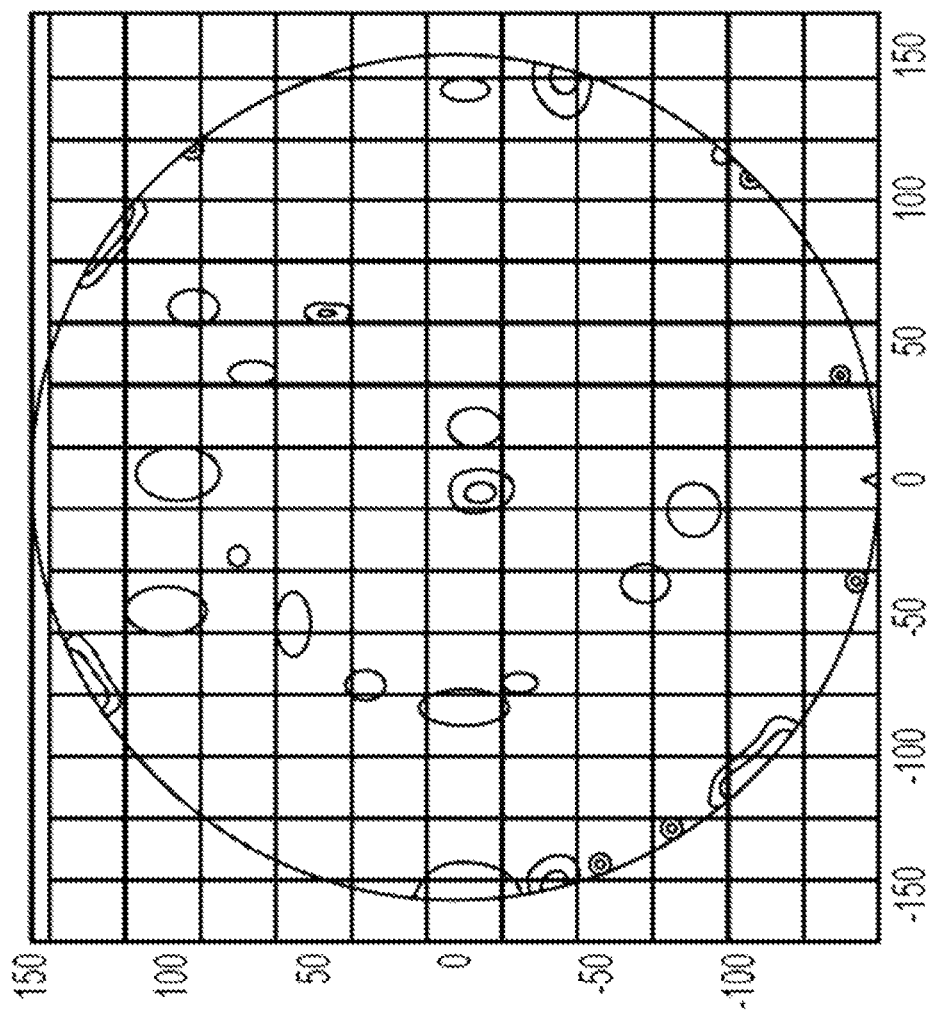
FIG. 7 shows an exemplary map for focus.

In step 213, an actual value of the processing parameter is determined. During a lithographic process the pattern may be produced using specific settings of the processing parameters which, for example, may be chosen to ensure that the pattern will be processed within the process window. However, the actual processing parameter at which the pattern is produced may be different from the set parameter, for example, due to drift of the lithographic process, or, for example, due to globally set processing parameters which may locally deviate. One such local deviation of a globally set processing parameter may, for example, be a focus position, which may globally be at the set processing parameter, but which locally may differ due to, for example, a tilt of the substrate during the lithographic process. So for a specific hot spot, the actual value of the processing parameter may vary from a set processing parameter. One exemplary way to determine the actual value of the processing parameter is to determine the status of the lithographic apparatus. For example, actual wafer stage position and tilt may be used to calculate the local actual value of the processing parameter. But also actual reticle stage position and tilt, laser bandwidth, focus, dose, source parameters, projection optics parameters, and the spatial or temporal variations of these parameters, may be measured directly from the lithographic apparatus and used to determine the actual value of the processing parameter. Another exemplary way is to infer the processing parameters from data obtained from metrology performed on the substrate. This metrology is performed on an already exposed substrate and may, for example, be used to identify machine drift. Alternatively, the actual value of the processing parameter may be obtained from an operator of the processing apparatus. For example, metrology may include inspecting a substrate using a diffractive tool (e.g., ASML YieldStar, or a diffraction phase microscopy), an electron microscope, or other suitable inspection tools. It is possible to obtain processing parameters for any location on a processed substrate, including the identified hot spots. The processing parameters may be compiled into a map—lithographic parameters, or process conditions, as a function of location. FIG. 7 shows an exemplary map for focus. Of course, other processing parameters may be represented as functions of location, i.e., a map. In an embodiment, the processing parameters may be determined before, and preferably immediately before or even during processing each hot spot.

In step 214, existence, probability of existence, characteristics, or a combination thereof, of a defect produced from the hot spot is determined using the actual value of the processing parameter. This determination or prediction may be simply by comparing the actual value of the processing parameter with the range of values thereof determined in step 212—if the actual value falls within the range, no defect will be expected to exist; if the actual value falls outside the range, at least one defect will be expected to exist. This determination or prediction may also be done using a suitable empirical model (including a statistical model). For example, a classification model may be used to provide a probability of existence of a defect. Another way to make this determination is to use a computational model to simulate an image or expected patterning contours of the hot spot under the actual value and determining the expected image or contour parameters from such simulation. The determined existence and/or characteristics of a defect may serve as a basis for a decision of disposition: rework, detailed inspection using, for example, an inspection tool such as an electron microscope, or acceptance of the possible defect. In an embodiment, the actual value is a moving average of the processing parameter. Moving averages are useful to capture long term drifts of the processing parameter, without distraction by short term fluctuations.

In optional step 215, the processing parameter may be adjusted or compensated for using the existence, probability of existence, characteristics, or a combination thereof as determined in step 214 (i.e., the prediction or determination is fed back to adjust the processing parameter), so that the defect is eliminated or its severity reduced. This process may, for example, be used to continuously monitor drift in the lithographic process and reduce this drift. In a feed-forward example, if the hot spot to be imaged would be located on a bump of a substrate, thereby causing the actual value of the focus to fall outside a range of value for the focus, the focus or levelling of the die may be adjusted to fall into the range before imaging the hot spot onto the substrate, thereby eliminating or strongly reducing the defect on that hot spot. In this example, if adjusting the focus is undesirable (e.g., due to limitation of hardware, or side effect of such adjustment), it may be compensated for by adjusting other parameters, thereby changing the range of the overall processing parameters such that the actual value of the focus falls within an acceptable range. Preferably, the processing parameter is adjusted or compensated for immediately before processing the hot spot. Steps 214 and 215 may be reiterative. The processing parameter may also be adjusted or compensated for after processing of one or multiple substrates, especially when an average (e.g., a moving average) of the processing parameter is determined, in order to accommodate systematic or slowly varying process variations, or to address a larger number of adjustable processing parameters. Adjustment or compensation of the processing parameter may include adjustment to wafer stage position and tilt, reticle stage position and tilt, focus, dose, source or pupil phase.

In optional step 216, existence and/or characteristics of a residue defect may be determined using the adjusted processing parameter. A residue defect is a defect that cannot be eliminated by adjusting the processing parameter. This determination may be simply comparing the adjusted processing parameter and the range—if the adjusted processing parameter falls within the range, no residue defect is expected to exist; if the adjusted processing parameter falls outside the range, at least one residue defect will be expected to exist. This determination may also be done using a suitable empirical model (including a statistical model). For example, a classification model may be used to provide a probability of existence of a residue defect. Another way to make this determination is to use a computational model to simulate an image or expected patterning contours of the hot spot under the adjusted processing parameters and determine the expected image or contour parameters from such simulation. The determined existence and/or characteristics of a residue defect may serve as a basis for a decision of disposition: rework, detailed inspection using, for example, an inspection tool, or acceptance.

In optional step 217, an indication of which hot spots are subject to inspection may be made at least partially based on the determined or predicted existence, probability of existence, one or more characteristics, or a combination thereof, of the residue defect or the defect. For example, if a substrate has a probability of having one or more residue defects or defects, the substrate may be subject to substrate inspection. The prediction or determination of residue defects or defects feeds forward to inspection. These hot spots may be actually inspected using a suitable inspection tool to confirm whether a defect is actually present, which makes it possible to avoid inspecting all patterns in the portion of the design layout. In the known lithographic process flow, an initial bright-field inspection is performed (typically "die-to-die" or "die-to-database") substantially on the whole substrate to get an initial indication where possible defects may be located on the substrate. This is a relatively time consuming process in which possible defects may be identified at random. The currently known bright-field inspection tools capture a relatively low resolution image from which only an indication of a possible defect can be obtained (often via the interpretation of the image by an experience operator). The identified locations of these possible defects as identified by the bright-field inspection tool will typically be further inspected using a detailed inspection tool, such as an electron microscope. Using the computer-implemented defect prediction tool according to the disclosure may replace at least a part of the bright-field inspection step. Using the actual value of the processing parameter present during the manufacturing process allows to predict—without using these bright-field inspections—where defects may be expected and what locations the detailed inspection tool should further investigate or should acknowledge the existence of the defect. Furthermore, the use of the computer implemented defect prediction tool according to the disclosure enables to actively look for defects, guided by the local actual values of the processing parameters. This use of the defect prediction tool may make the process of finding possible defects less random. In an alternative process flow, the computer-implemented defect prediction tool may be used to guide the bright-field inspection tools to investigate only part of the substrate—thereby allowing significant reduction of the overall inspection time at the bright-field inspection tools and making the overall defect inspection by the bright-field tools less random. The result of the inspection may be used to decide what to do with the pattern from the currently used lithographic process step: accept the current process step, or, if possible and necessary, rework the current lithographic process step. Such rework may, for example, include the stripping of the defective resist layer and re-applying a new resist layer and repeating the lithographic process step. The result of the inspection may also be used to adjust the range of values of the processing parameter of the device manufacturing process used to determine whether a hot spot may become a defect when processed at a processing parameter having a value outside the range. This adjustment of the range of values may make the defect determination or prediction more accurate. It is also possible to adjust the stringency of inspection by increasing or decreasing the range in step 212 before step 214. Decreasing the range causes more findings of a defect and possibly more false positives.

FIG. 3 shows exemplary sources of the processing parameter 350. One source may be data 310 of the processing apparatus, such as parameters of the source, projection optics, substrate stage, etc. of a lithography apparatus. Another source may be data 320 from various substrate metrology tools, such as wafer height map, focus map, CDU map, overlay map etc. Data 320 may be obtained before substrates are subject to a step (e.g., etch) that prevents reworking of the substrate. Another source may be data 330 from various patterning device metrology tools, mask CDU map, mask film stack parameters variation, etc. Yet another source may be data 340 from an operator of the processing apparatus.

FIG. 4 shows an exemplary implementation of step 214 of FIG. 2. The processing parameter 420 may be used as input (e.g., independent variables) to a classification model 430. The processing parameter 420 may include a characteristic of the source (e.g., intensity, pupil profile, etc.), a characteristic of the projection optics, dose, focus, characteristics of the resist, a characteristic of development and post-exposure baking of the resist, or a characteristic of etching, actual wafer stage position and tilt, actual reticle stage position and tilt. The term "classifier" or "classification model" sometimes also refers to the mathematical function, implemented by a classification algorithm, that maps input data to a category. In machine learning and statistics, classification is the problem of identifying to which of a set of categories 440 (sub-populations) a new observation belongs, on the basis of a training set of data containing observations (or instances) whose category membership is known. The individual observations are analyzed into a set of quantifiable properties, known as various explanatory variables, features, etc. These properties may variously be categorical (e.g. "good"—a lithographic process that does not produce defects or "bad"—a lithographic process that produces defects; "type 1", "type 2", . . . "type n"—different types of defects). Classification is considered an instance of supervised learning, i.e. learning where a training set of correctly identified observations is available. Examples of classification models are, logistic regression and multinomial logit, probit regression, the perceptron algorithm, support vector machines, import vector machines, and linear discriminant analysis.

Figure 5A:
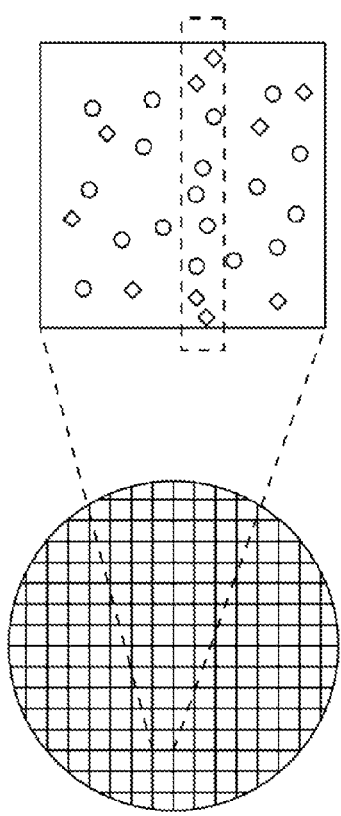
FIG. 5A shows an exemplary substrate with many dies.
Figure 5B:
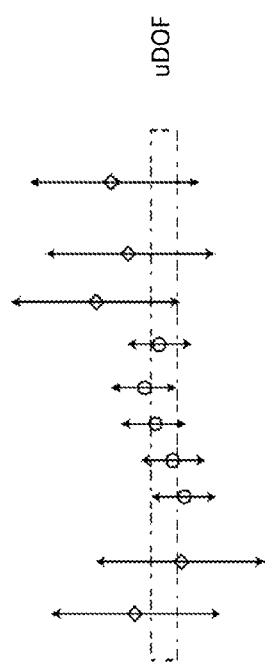
FIG. 5B shows a usable depth of focus (uDOF) obtained using a traditional method.
Figure 5C:
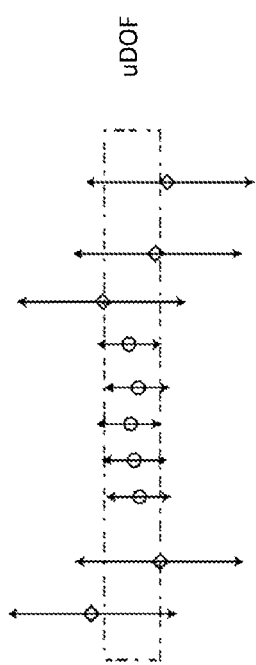
FIG. 5C shows a usable depth of focus (uDOF) obtained using a method according to an embodiment described herein.
Figure 6:
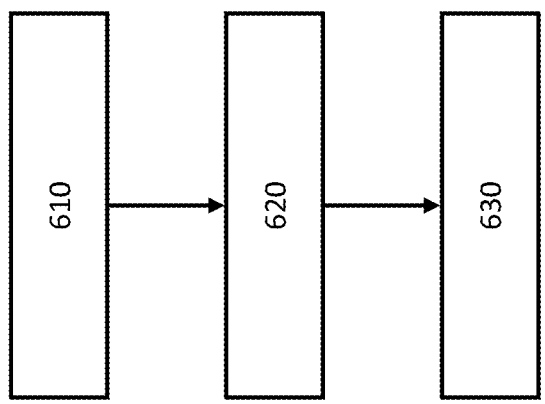
FIG. 6 shows a schematic flow diagram for a processing flow.

One example of the processing parameters is substrate levelling. FIG. 5A shows an exemplary substrate with many dies (depicted as grids). In a die called out, hot spots (depicted as circles) are identified along with less critical positions (i.e., positions that are not process window limiting, depicted as diamonds) in the patterns in the die. FIG. 5B shows a usable depth of focus (uDOF) obtained using a traditional method. uDOF is the depth of focus that falls within the process windows of all the patterns in an exposure slit. FIG. 5C shows a usable depth of focus (uDOF) obtained using a method according to an embodiment described herein, where less critical positions regions (diamonds) are allowed to drift farther away from their respective best focuses to bring the best focuses of the hot spots (circles) closer by adjusting the processing parameters including the substrate levelling, thereby increasing the uDOF. According to an embodiment, a method described herein allows adjustment of processing parameters for each substrate or even each die or even at specific locations within a die. FIG. 6 shows a schematic flow diagram for a processing flow. In step 610, processing parameters immediately (e.g., after processing the immediately previous substrate or die) before processing a substrate or a die are determined. In step 620, a prediction or determination of the existence of a defect, probability of existence of a defect, a characteristic of a defect, or a combination thereof is made using the processing parameters immediately before processing the substrate or the die, and using a characteristic of the substrate or the die (e.g., as determined from metrology on the substrate or the die) and/or a characteristic of the geometry of patterns to be processed onto the substrate or the die. In step 630, the processing parameters are adjusted based on the prediction so as to eliminate, reduce the probability or severity of the defect. Alternatively, it may be known from simulations of the layout to be processed that the PWLP may be located at a specific area within a die. In such a situation, the system in the imaging tool which ensures the leveling of the die before exposure in the imaging tool may ensure that this specific area is in focus allowing other areas of the die to divert further from focus to ensure that the PWLP are imaged in spec. The simulations may further be used to determine whether the less critical structures are still imaged correctly due to the less favorable processing conditions because of the preferred leveling accuracy of the area containing the PWLPs. According to an embodiment, a method described herein allows inspection of fewer substrates among a production batch while maintaining comparable defect rates to that in a conventional processing flow. A conventional processing flow involves processing (e.g., exposing in a lithography apparatus) a batch of substrates, 2%-3% or more of the batch has to be inspected in order to catch most of the defects. Inspection is usually destructive. Therefore, 2%-3% or more of the batch is wasted and adds to the cost of processing. The method described herein allows a processing flow in which less than 2%, less than 1.5%, or less than 1% of a batch of substrates to be inspected without adverse effects such as increase defect rates. Specifically, the method described herein enables a method of manufacturing a device involving processing patterns onto a batch of substrates, e.g., using a lithography apparatus, the method including: processing the batch of substrates, destructively inspecting less than 2%, less than 1.5%, or less than 1% of the batch to determine existence of defects in the patterns processed onto the substrates.

Figure 8:
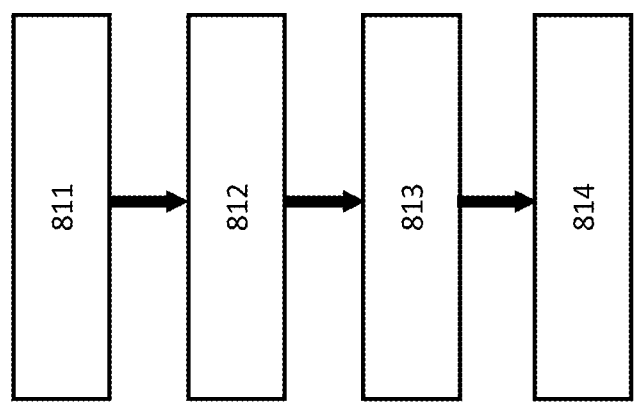
FIG. 8 shows a flow chart for a method of defect prediction for a device manufacturing process involving processing a portion of a design layout onto a substrate, according to an embodiment.

FIG. 8 shows a flow chart for a method of defect prediction for a device manufacturing process involving processing a portion of a design layout onto a substrate, according to an embodiment. In step 811, a hot spot is identified from the portion of the design layout. The hot spot may be identified using any suitable method such as those described above. In step 812, a sensitivity of the hot spot with respect to a processing parameter of the device manufacturing process is determined. One way to determine the sensitivity is simply by deducing a partial derivative of a characteristic of the hot spot with respect to the processing parameter, from a model that simulates the characteristic at least partially based on the processing parameter. Another way is simulating a characteristic of the hot spot under at least two values of the processing parameter. In step 813, a mark with the same or similar sensitivity is generated or a mark with the same or (most) similar sensitivity is selected from a pool of marks designed for a specific lithography tool or a specific metrology tool. The mark may be a scatterometry target suitable for ADI or after-development-inspection (AEI). A scatterometry target may include arrays of uniformly constructed and uniformly spaced periodic features (for example an array of 100 nm diameter dots). In step 814, the designed or selected mark is added into the design layout and processed in the same way as the design layout on the substrate. For example, the mark may be added into the dies—integrated into the design layout, between the dies—added to the so-called scribe lanes on a substrate, or at the edge of the substrate or otherwise in between dies. The mark may be inspected in lieu of or in addition to the hot spot. More information of generating or selecting the mark may be found in commonly-assigned U.S. patent application Ser.

No. 13/542,625, 61/921,874, 61/921,907, 61/921,939, 61/921,817, each of which is hereby incorporated by reference in its entirety.

FIG. 9 shows a flow chart for a method of defect prediction for a device manufacturing process involving processing a portion of a design layout onto a substrate, according to an embodiment. In step 911, an actual value of a processing parameter of the device manufacturing process is determined. One exemplary way to determine the processing parameter is to determine the status of the lithographic apparatus. For example, actual wafer stage position and tilt, actual reticle stage position and tilt, laser bandwidth, focus, dose, source parameters, projection optics parameters, and the spatial or temporal variations of these parameters, may be measured from the lithographic apparatus. Another exemplary way is to infer the processing parameters from data obtained from metrology performed on the substrate, or from operator of the processing apparatus. For example, metrology may include inspecting a substrate using a diffractive tool (e.g., ASML YieldStar), an electron microscope, or other suitable inspection tools. It is possible to obtain processing parameters for any location on a processed substrate, including the identified hot spots. In step 912, an inspection map is constructed based at least partially on the actual value. The inspection map includes positions of potential defects on the substrate. The potential defects may be identified by comparing the actual value with a position-dependent range, where if the actual value falls outside the range at a position, a potential defect exists at that position. In step 913, the substrate is inspected at the positions of potential defects. In an embodiment, the substrate is inspected at only the positions of potential defects. Alternatively, in step 914, the inspection map is presented to a user.

According to an embodiment, a metrology tool configured to inspect a substrate may be configured to receive positions of potential defects from any of the methods described above. For example, the metrology tool may be a diffractive tool, a bright-field inspection tool or an electron microscope.

The invention may further be described using the following clauses:

1. A computer-implemented defect prediction method for a device manufacturing process involving processing a portion of a design layout onto a substrate, the method comprising:

identifying a hot spot from the portion of the design layout;

determining a range of values of a processing parameter of the device manufacturing process for the hot spot, wherein when the processing parameter has a value outside the range, a defect is produced from the hot spot with the device manufacturing process;

determining an actual value of the processing parameter;

determining or predicting, using the actual value, existence, probability of existence, a characteristic, or a combination thereof, of a defect produced from the hot spot with the device manufacturing process.

2. The method of clause 1, wherein the determining or predicting the existence, the probability of existence, the characteristic, or the combination thereof, further uses a characteristic of the hot spot, a characteristic of the design layout, or both 3. The method of clause 1 or clause 2, further comprising adjusting or compensating for the processing parameter using the existence, the probability of existence, the characteristic, or the combination thereof, of the defect.

4. The method of clause 3, further comprising carrying out reiteratively the determining or predicting the existence, the probability of existence, the characteristic, or the combination thereof, of the defect, and adjusting or compensating for the processing parameter.

5. The method of clause 3 or clause 4, further comprising determining or predicting, using the adjusted or compensated processing parameter, existence, probability of existence, a characteristic, or a combination thereof, of a residue defect produced from the hot spot using the device manufacturing process.

6. The method of clause 5, further comprising indicating whether the hot spot is to be inspected at least partially based on the determined or predicted existence, probability of existence, the characteristic, or the combination thereof, of the residue defect.

7. The method of any of clauses 1 to 4, further comprising indicating whether the hot spot is to be inspected at least partially based on the determined or predicted existence, probability of existence, the characteristic, or the combination thereof, of the defect.

8. The method of any of clauses 1 to 7, wherein the hot spot is identified using an empirical model or a computational model.

9. The method of any of clauses 1 to 8, wherein the processing parameter is any one or more selected from: actual wafer stage position and tilt, actual reticle stage position and tilt, focus, dose, a source parameter, a projection optics parameter, data obtained from metrology, and/or data from an operator of a processing apparatus used in the device manufacturing process.

10. The method of clause 9, wherein the processing parameter is data obtained from metrology and the data obtained from metrology is obtained from a diffractive tool, or an electron microscope.

11. The method of any of clauses 1 to 10, wherein the processing parameter is determined or predicted using a model or by querying a database.

12. The method of any of clauses 1 to 11, wherein the determining or predicting the existence, the probability of existence, the characteristic, or the combination thereof, of the defect comprises simulating an image or expected patterning contours of the hot spot under the processing parameter and determining an image or contour parameter.

13. The method of clause 8, wherein the hot spot is identified using a sensitivity of patterns of the portion, with respect to the processing parameter.

14. The method of any of clauses 6 to 7, further comprising inspecting the hot spot.

15. The method of clause 14, further comprising adjusting the range of values at least partially based on inspection of the hot spot.

16. The method of any of clauses 1 to 15, wherein the device manufacturing process involves using a lithography apparatus.

17. The method of any of clauses 1 to 16, wherein the processing parameter is determined immediately before the hot spot is processed.

18. The method of any of clauses 1 to 17, wherein the processing parameter is selected from local processing parameters or global processing parameters.

19. The method of any of clauses 1 to 18, wherein identifying the hot spot includes identifying a location thereof.

20. The method of any of clauses 1 to 19, wherein the defect is undetectable before the substrate is irreversibly processed.

21. A method of manufacturing a device involving processing a pattern onto a substrate or onto a die of the substrate, the method comprising:

determining a processing parameter before processing the substrate or the die;

predicting or determining existence of a defect, probability of existence of a defect, a characteristic of a defect, or a combination thereof, using the processing parameter before processing the substrate or the die, and using a characteristic of the substrate or the die, a characteristic of the geometry of a pattern to be processed onto the substrate or the die, or both;

adjusting the processing parameter based on the prediction or determination so as to eliminate, reduce the probability of or reduce the severity of, the defect.

22. The method of clause 21, further comprising identifying a hot spot from the pattern.

23. The method of clause 21, wherein the defect is a defect produced from the hot spot.

24. The method of clause 21, wherein the characteristic of the substrate or the die is a process window of the hot spot.

25. A computer-implemented defect prediction method for a device manufacturing process involving processing a portion of a design layout onto a substrate, the method comprising:

identifying a hot spot from the portion of the design layout;

determining or predicting existence, probability of existence, a characteristic, or a combination thereof, of a defect produced from the hot spot with the device manufacturing process;

determining whether to inspect the hot spot at least partially based on the determination or prediction of the existence, probability of existence, a characteristic, or a combination thereof, of the defect.

26. A computer-implemented defect prediction method for a device manufacturing process involving processing a portion of a design layout onto a substrate, the method comprising:

identifying a hot spot from the portion of the design layout;

determining a sensitivity of the hot spot with respect to a processing parameter of the device manufacturing process for the hot spot;

generating a mark having the same sensitivity;

adding the mark into the design layout.

27. A method of manufacturing a device comprising: the computer-implemented defect prediction method according to any of clauses 1 to 26; and indicating which of plurality of hot spots to inspect at least partially based on the determined or predicted existence, probability of existence, characteristic, or the combination thereof, of the defect.

28. The method of any of clauses 1 to 27, wherein the defect is one or more selected from: necking, line pull back, line thinning, CD error, overlapping, resist top loss, resist undercut and/or bridging.

29. A method of defect prediction for a device manufacturing process involving processing a portion of a design layout onto a substrate, comprising:

determining an actual value of a processing parameter of the device manufacturing process;

constructing an inspection map based at least partially on the actual value, wherein the inspection map comprises positions of potential defects on the substrate.

30. The method of clause 29, further comprising inspecting the substrate at the positions of potential defects.

31. The method of clause 29, further comprising inspecting the substrate at only the positions of potential defects.

32. The method of clause 30 or 31, wherein inspecting the substrate is performed using an electron microscope or a bright-field inspection tool.

33. The method of clause 29, further comprising presenting the inspection map to a user.

34. The method of clause 29, wherein constructing the inspection map further comprises simulating at least some of the identified potential defects using a process simulation model.

35. The method of clause 29 or 34, wherein constructing the inspection map further comprises to construct the inspection map in a format readable by a defect inspection tool.

36. A computer program product comprising a computer readable medium having instructions recorded thereon, the instructions when executed by a computer implementing the method of any of clauses 1 to 35.

37. A metrology tool configured to inspect a substrate onto which a portion of a design layout is processed by a device manufacturing process, comprising:

a data transfer unit configured to receive positions of potential defects on the substrate;

an inspection unit configured to selectively inspect the substrate at the positions.

38. The metrology tool of clause 37, wherein the metrology tool is a diffractive tool or an electron microscope.

39. A metrology system for inspecting a substrate onto which a portion of a design layout is processed, the metrology system comprising the first metrology tool for determining an actual value of the processing parameter, and a defect prediction unit configured for executing a computer implemented method of any of the clauses 1 to 35.

40. The metrology system according to clause 39, wherein the metrology system further comprises a second metrology tool being the metrology tool as claimed in any of the clauses 37 and 38.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The description is not intended to limit the invention.

The invention claimed is:

1. A defect prediction method for a device manufacturing process involving processing a portion of a design layout onto a substrate, the method comprising:

identifying a hot spot from the portion of the design layout;

determining a range of values of a processing parameter of the device manufacturing process for the hot spot, wherein when the processing parameter has a value outside the range, a defect is produced from the hot spot using the device manufacturing process;

determining an actual value of the processing parameter; and determining or predicting, using the actual value and by a computer hardware system, an existence, a probability of existence, a characteristic, or a combination selected therefrom, of a defect produced from the hot spot using the device manufacturing process.

2. The method of claim 1, wherein the determining or predicting an existence, a probability of existence, a characteristic, or a combination selected therefrom, of a defect further comprises using a characteristic of the hot spot, a characteristic of the design layout, or both, to determine or predict an existence, a probability of existence, a characteristic, or a combination selected therefrom, of a defect.

3. The method of claim 1, further comprising adjusting, or compensating for the processing parameter using the existence, the probability of existence, the characteristic, or the combination selected therefrom, of the defect.

4. The method of claim 3, further comprising determining or predicting, using the adjustment of, or compensation for, the processing parameter, an existence, a probability of existence, a characteristic, or a combination selected therefrom, of a residue defect produced from the hot spot using the device manufacturing process.

5. The method of claim 4, further comprising indicating whether the hot spot is to be inspected at least partially based on the determined or predicted existence, probability of existence, the characteristic, or the combination selected therefrom, of the residue defect.

6. The method of claim 5, further comprising inspecting the hot spot as produced on the substrate using the device manufacturing process.

7. The method of claim 1, further comprising indicating whether the hot spot is to be inspected at least partially based on the determined or predicted existence, probability of existence, characteristic, or combination selected therefrom, of the defect produced from the hot spot using the device manufacturing process.

8. The method of claim 7, further comprising inspecting the hot spot as produced on the substrate using the device manufacturing process.

9. The method of claim 1, wherein the hot spot is identified using an empirical model or a computational model.

10. The method of claim 8, wherein the hot spot is identified using a sensitivity of a pattern of the portion, with respect to the processing parameter.

11. The method of claim 1, wherein the processing parameter is any one or more selected from: actual substrate stage position and/or tilt, actual reticle stage position and/or tilt, focus, dose, an illumination parameter, a projection optics parameter, data obtained from metrology, and/or data from an operator of a processing apparatus used in the device manufacturing process.

12. The method of claim 1, wherein the determining or predicting an existence, a probability of existence, a characteristic, or a combination selected therefrom, of a defect comprises simulating an image, or an expected patterning contour, of the hot spot under the processing parameter and determining an image parameter or contour parameter.

13. The method of claim 1, wherein the identifying a hot spot includes identifying a location thereof.

14. The method of claim 1, wherein the defect is undetectable before the substrate is irreversibly processed.

15. A method of manufacturing a device involving processing a pattern onto a substrate or onto a die of the substrate, the method comprising:

determining a processing parameter before processing the substrate or the die;

predicting or determining, by a computer hardware system, an existence of a defect, a probability of existence of a defect, a characteristic of a defect, or a combination selected therefrom, using the processing parameter before processing the substrate or the die, and using a characteristic of the substrate or the die, a characteristic of a geometry of a pattern to be processed onto the substrate or the die, or both; and adjusting the processing parameter based on a prediction or a determination, obtained in the predicting or determining, so as to eliminate, reduce the probability of existence of, or reduce a severity of, the defect.

16. A defect prediction method for a device manufacturing process involving processing a portion of a design layout onto a substrate, the method comprising:

identifying a hot spot from the portion of the design layout;

determining or predicting, by a computer hardware system, an existence, a probability of existence, a characteristic, or a combination selected therefrom, of a defect produced from the hot spot using the device manufacturing process; and determining whether to inspect the hot spot at least partially based on a determination or a prediction of the existence, the probability of existence, the characteristic, or a combination selected therefrom, of the defect obtained in the determining or predicting.

17. A defect prediction method for a device manufacturing process involving processing a portion of a design layout onto a substrate, the method comprising:

identifying a hot spot from the portion of the design layout;

determining, by a computer hardware system, a sensitivity of the hot spot with respect to a processing parameter of the device manufacturing process for the hot spot;

generating a metrology mark having a substantially same value of the sensitivity; and adding the mark into the design layout.

18. A method of defect prediction for a device manufacturing process involving processing a portion of a design layout onto a substrate, the method comprising:

determining an actual value of a processing parameter of the device manufacturing process; and constructing, by a computer hardware system, an inspection map based at least partially on the actual value, wherein the inspection map comprises positions of potential defects on the substrate.

19. The method of claim 18, further comprising inspecting the substrate at the positions of potential defects.

20. The method of claim 18, wherein the constructing an inspection map further comprises simulating at least some of the potential defects using a process simulation model.

* * * * *